United States Patent
Minamihaba et al.

(10) Patent No.: US 7,459,398 B2
(45) Date of Patent: Dec. 2, 2008

(54) SLURRY FOR CMP, POLISHING METHOD AND METHOD OF MANUFACTURING SEMICONDUCTOR DEVICE

(75) Inventors: Gaku Minamihaba, Yokohama (JP); Yukiteru Matsui, Yokohama (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 580 days.

(21) Appl. No.: 11/170,173

(22) Filed: Jun. 30, 2005

(65) Prior Publication Data

US 2006/0030503 A1    Feb. 9, 2006

(30) Foreign Application Priority Data

Aug. 6, 2004    (JP)    ............... 2004-231167

(51) Int. Cl.
*C11D 7/32* (2006.01)

(52) U.S. Cl. ............ 438/692; 438/693; 510/175; 134/1.3

(58) Field of Classification Search ......... 438/692, 438/693; 510/175; 134/1.3
See application file for complete search history.

(56) References Cited

U.S. PATENT DOCUMENTS

| | | | |
|---|---|---|---|
| 5,842,910 A * | 12/1998 | Krywanczyk et al. | ......... 451/41 |
| 6,270,393 B1 | 8/2001 | Kubota et al. | |
| 6,443,812 B1 * | 9/2002 | Costas et al. | ............. 451/41 |
| 6,641,630 B1 * | 11/2003 | Sun | ................. 51/307 |
| 6,794,285 B2 | 9/2004 | Matsui et al. | |
| 6,830,503 B1 * | 12/2004 | Grumbine | ............ 451/41 |
| 6,914,001 B2 * | 7/2005 | Lee et al. | ............. 438/692 |
| 7,060,621 B2 * | 6/2006 | Minamihaba et al. | ....... 438/692 |
| 7,166,017 B2 * | 1/2007 | Minamihaba et al. | ......... 451/36 |
| 7,332,104 B2 * | 2/2008 | Minamihaba et al. | ...... 252/79.1 |
| 7,402,521 B2 * | 7/2008 | Matsui et al. | .......... 438/692 |
| 2002/0076932 A1 * | 6/2002 | Dirksen et al. | ............ 438/690 |
| 2004/0261323 A1 * | 12/2004 | Minamihaba et al. | ......... 51/309 |
| 2005/0064796 A1 * | 3/2005 | Minamihaba et al. | ......... 451/36 |
| 2006/0197055 A1 * | 9/2006 | Minamihaba et al. | ...... 252/79.1 |

FOREIGN PATENT DOCUMENTS

| JP | 2002-256256 | 9/2002 |
|---|---|---|
| JP | 2003-289054 | 10/2003 |
| JP | 2004-189894 | 7/2004 |

OTHER PUBLICATIONS

Notification of Reasons for Rejection issued by the Japanese Patent Office on Jun. 12, 2007, for Japanese Patent Application No. 2004-231167, and English-language translation thereof.

* cited by examiner

*Primary Examiner*—Gregory E Webb
(74) *Attorney, Agent, or Firm*—Finnegan, Henderson, Farabow, Garrett & Dunner, L.L.P.

(57) ABSTRACT

Disclosed is a CMP slurry comprising an abrasive grain, and a mixed surfactant comprising a first polyether type nonionic surfactant having an HLB value ranging from 3 to 9 at room temperature, and a second polyether type nonionic surfactant having an HLB value ranging from 10 to 20 at room temperature.

7 Claims, 2 Drawing Sheets

SLURRY FOR CMP, POLISHING METHOD AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-231167, filed Aug. 6, 2004, the entire contents of which are incorporated herein by reference.

BACKGROUND OF THE INVENTION

1. Field of the Invention

The present invention relates to a slurry to be used for chemical mechanical polishing (CMP), a polishing method using the slurry, and a method of manufacturing a semiconductor device wherein the slurry is employed.

2. Description of the Related Art

More increased fineness and more increased integration of elements would be inevitably required in the high performance LSI of the next generation. Furthermore, a multi-layer structure would be also required in the high performance LSI of the next generation. As a result of these requirements, it is now desired, on the occasion of CMP in the planarizing process in the manufacture of a semiconductor device, to suppress the magnitude of local depression (erosion) on the surface to not more than 20 nm in depth.

In the case of the CMP of Cu, since it is required that three kinds of materials such as Cu, Ta and hydrophobic SiOC are concurrently polished, the suppression of erosion is especially difficult. The local depression may generate even when forming embedded insulating film, so that the local depression may become a cause for problems when depositing an organic film such as a resist film on an underlying layer having a trench formed therein. As effective measures for suppressing the erosion, there has been proposed an idea of using a slurry containing a nonionic surfactant having a predetermined range of HLB value. Further, there has been also proposed to employ a slurry where a nonionic surfactant having a specific range of HLB value is employed in combination with an ionic surfactant.

However, even with the employment of these slurries, it is impossible to sufficiently suppress the erosion, so that there are persistent demands for further improvement.

Moreover, there has been also proposed, with a view of minimizing the dishing of Cu film, to employ a metal-polishing composition comprising a composite particle that can be produced from the combined use of polyoxoacid and two or more kinds of nonionic surfactants differing in HLB value from each others. This metal-polishing composition has been actually tried to use in a method of polishing a Cu film at a load of as low as 15 kPa (153 gf/cm$^2$) or less. However, according to this method, since this metal-polishing composition contains no abrasive grain which can contribute to mechanical polishing, it is difficult to secure in-plane uniformity, thus leading to the generation locally of a large magnitude of the dishing of Cu film.

BRIEF SUMMARY OF THE INVENTION

A CMP slurry according to one aspect of the present invention comprises an abrasive grain; and a mixed surfactant comprising a first polyether type nonionic surfactant having an HLB value ranging from 3 to 9 at room temperature, and a second polyether type nonionic surfactant having an HLB value ranging from 10 to 20 at room temperature.

A CMP slurry according to another aspect of the present invention comprises an abrasive grain; and a mixed surfactant comprising a first nonionic surfactant having a clouding point ranging from 19 to 51° C., and a second nonionic surfactant having a clouding point of 55° C. or more.

A polishing method according to one aspect of the present invention comprises contacting a polishing surface of a semiconductor substrate with a polishing pad attached to a turntable; and dropping a CMP slurry onto the polishing pad to polish the polishing surface, the CMP slurry being selected from the group consisting of a first slurry and a second slurry, the first slurry comprising an abrasive grain, and a mixed surfactant comprising a first nonionic surfactant formed of a polyether type nonionic surfactant having an HLB value ranging from 3 to 9 at room temperature and a second nonionic surfactant formed of a polyether type nonionic surfactant having an HLB value ranging from 10 to 20 at room temperature, and the second slurry comprising an abrasive grain, and a mixed surfactant comprising a first nonionic surfactant having a clouding point ranging from 19 to 51° C. and a second nonionic surfactant having a clouding point of 55° C. or more.

A method of manufacturing a semiconductor device according to one aspect of the present invention comprises forming an insulating film above a semiconductor substrate; forming a recess in the insulating film; depositing a conductive material inside the recess and above the insulating film to form a conductive layer; and removing the conductive material which is deposited above the insulating film by CMP using a CMP slurry to expose the insulating film while selectively leaving the conductive material in the recess; the CMP slurry being selected from the group consisting of a first slurry and a second slurry, the first slurry comprising an abrasive grain, and a mixed surfactant comprising a first nonionic surfactant formed of a polyether type nonionic surfactant having an HLB value ranging from 3 to 9 at room temperature and a second nonionic surfactant formed of a polyether type nonionic surfactant having an HLB value ranging from 10 to 20 at room temperature, and the second slurry comprising an abrasive grain, and a mixed surfactant comprising a first nonionic surfactant having a clouding point ranging from 19 to 51° C. and a second nonionic surfactant having a clouding point of 55° C. or more.

DETAILED DESCRIPTION OF THE INVENTION

Figure 1:
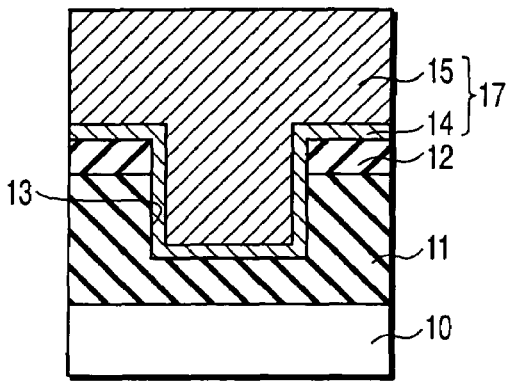
FIG. 1 is a cross-sectional view illustrating one step in the method of manufacturing a semiconductor device according to one embodiment of the present invention.

Next, embodiments of the present invention will be explained with reference to the drawings.

The CMP slurry according to one embodiment of the present invention contains two kinds of polyether type nonionic surfactants each having a specific range of hydrophile-lipophile-balance (HLB) value. The HLB value herein means an actually measured value. Specifically, this HLB value can be determined by measuring the volume eluted of a surfactant by using gel permeation chromatography (GPC). A first surfactant of these polyether type nonionic surfactants has an HLB value ranging from 3 to 9 at room temperature, and a second surfactant thereof has an HLB value ranging from 10 to 20 at room temperature. Incidentally, the term "room temperature" means 25° C. Since these two kinds of surfactants are included in the slurry, it is now possible, through the employment of this slurry according to one embodiment of the present invention, to reduce the erosion of the surface to not more than 20 nm in depth in the polishing.

More specifically, when the polishing is performed by using the slurry according to the embodiment of the present invention, the first surfactant which is relatively high in hydrophobicity at first adsorb onto the polishing surface to make the polishing surface hydrophilic. Generally, a surfactant which is small in HLB value is small in molecular weight, so that the first surfactant can be readily adsorbed onto the polishing surface. When the temperature of the polishing surface rises during the polishing up to higher than the clouding point of the first surfactant, the second surfactant further adsorb to the first surfactant, thereby making the polishing surface hydrophilic, thus making it possible to suppress the erosion. Moreover, since these two kinds of surfactants are not provided with polarity, these surfactants can be prevented from excessively adsorbing onto the substrate.

Incidentally, even when a polymer such as ammonium polyacrylate is adsorbed onto the polishing surface during the polishing, it is possible to suppress the erosion. However, since the average molecular weight of this polymer is as large as 5000 or so, there are much possibilities that cationic particles may aggregate due to counter anion or anionic particles may aggregate due to counter cation. In that case, the number of bulky particles would be increased, raising various problems such as abnormal polishing, the generation of a large number of scratches, etc. In the case of the slurry according to the embodiment of the present invention however, these problems can be overcome.

More specifically, the mechanism of adsorption of the surfactants in the employment of the slurry according to the embodiment of the present invention can be explained as follows. Generally speaking, the temperature of polishing pad when polishing is confined within the range of 30 to 60° C. Among the surfactants to be ordinarily employed in the slurry, a polyether type nonionic surfactant has a clouding point so that when temperature thereof is increased higher than a certain temperature, the solubility thereof in a solvent is quickly deteriorated, thus showing turbidity. Further, the hydrophilicity/hydrophobicity of a nonionic surfactant is represented by an HLB value, and as this HLB value becomes larger, the transparency of the nonionic surfactant would become more excellent. The present inventors have taken notice of the relationship between the clouding point of the polyether type nonionic surfactant and HLB value, finding that as the HLB value thereof becomes higher, the clouding point thereof also becomes higher.

Based on this finding, it has been found that if nonionic surfactants differ in HLB value from each other, the nonionic surfactants also differ in clouding point from each other, so that it is possible to select a surfactant having a desired clouding point by suitably determining the HLB value thereof. Generally speaking, the clouding point of a nonionic surfactant having an HLB value ranging from 3 to 9 at room temperature is more likely confined to the range lower than the temperature of polishing pad (for example, the temperature of polishing pad+3° C.), e.g., about 19-51° C. On the other hand, the clouding point of a nonionic surfactant having an HLB value ranging from 10 to 20 at room temperature is more likely confined to the range not lower than the temperature of polishing pad, e.g., generally not lower than 55° C. A nonionic surfactant which is high in hydrophobicity (the first nonionic surfactant) is enabled to preferentially adsorb onto the hydrophobic polishing surface of a substrate. When the temperature of the polishing surface of substrate is raised to reach the clouding point of the first nonionic surfactant during the polishing, the first nonionic surfactant is dehydrated to lose the hydrophilicity thereof. When the hydrophilicity is lost in this manner, the first nonionic surfactant that has been adsorbed onto the polishing surface of hydrophobic substrate becomes hydrophobic, thereby enabling the second surfactant to adsorb to the first nonionic surfactant. In order to secure these effects, the HLB value of the first surfactant is confined to 9 or less. On the other hand, in order to secure a stable dissolved state of the surfactant in practical viewpoint for using it as a slurry, the lower limit of the HLB value of the first surfactant should preferably be 3 or more.

Incidentally, there is a possibility that a region where the first surfactant is not adsorbed may exist on the polishing surface of substrate. This surface region still retaining hydrophilicity and the first surfactant which becomes hydrophobic are required to be adsorbed by a nonionic surfactant whose hydrophilicity may not lost. Because, in order to polish stably, it is indispensable that the polishing surface of substrate should be hydrophilic, which can be accomplished by employment of a second surfactant having an HLB value of not less than 10.

It has been found possible to minimize the erosion of the polishing surface of substrate by using a slurry containing a mixed surfactant comprising a nonionic surfactant having a clouding point which is lower than a temperature of exothermic heat to be generated by the friction between the polishing surface of substrate and a polishing pad in CMP, i.e., the surface temperature of the polishing pad, and a nonionic surfactant having a clouding point which is higher than the surface temperature of the polishing pad. As for the nonionic surfactant having a clouding point, it is possible to employ a polyether type nonionic surfactant.

As for specific examples of the polyether type nonionic surfactant, they include, for example, polyoxyethylene/methylpolysiloxane copolymer, poly(oxyethylene/oxypropylene) methylpolysiloxane copolymer, polyoxyethylene alkyl polysiloxane/polyoxypropylene alkyl polysiloxane/dimethyl polysiloxane copolymer, methyl polysiloxane/alkylmethyl polysiloxane/poly(oxyethylene/oxypropylene) methyl polysiloxane copolymer, polyoxyethylene lauryl ether, and acetylene glycol polyether adduct.

In the employment of these surfactants as the first and the second surfactants, the ratio (wt %) of the hydrophilic portion thereof should be adjusted, thereby adjusting the HLB value thereof to a predetermined range.

More specifically, the HLB value of the first surfactant should preferably be confined within the range of 3 to 7, the clouding point thereof in this case being around 19 to 32° C. Further, the HLB value of the second surfactant should preferably be confined within the range of 12 to 18, the clouding point thereof in this case being around 63 to 80° C. These first and second surfactants may be employed singly or in combination of two or more kinds.

The HLB value of the nonionic surfactant can be adjusted by changing the ratio of the hydrophilic portion thereof such, for example, as polyethylene oxide or polypropylene oxide. Further, the HLB value of the nonionic surfactant can be adjusted also by modifying the structure of the hydrophilic portion.

The slurry for CMP according to the embodiment of the present invention can be applied to the polishing of conductive materials such as Cu, of an insulating film and of an organic film such as a resist film. Irrespective of the kinds of materials to be polished, the hydrophobic portion of the nonionic surfactant should preferably be constituted by siloxane and acetylene glycol in order to secure excellent effects. Especially, if the material to be polished is formed of a Si-containing film such as SiOC, the hydrophobic portion of the nonionic surfactant should more preferably be constituted by siloxane. If the material to be polished is formed of a highly hydrophobic material, e.g., a carbon-containing material such as resist, the hydrophobic portion of the nonionic surfactant should more preferably be constituted by acetylene glycol.

When this slurry is to be applied to the polishing of conductive materials such as Cu, or to the polishing of an insulating film, the concentration of the aforementioned nonionic surfactant in the slurry should preferably be confined within the range of 0.01 to 1.0% by weight based on a total weight of the slurry. If the concentration of this nonionic surfactant is less than 0.01% by weight, it would be impossible to sufficiently secure the effects of the surfactant. On the other hand, if the concentration of this nonionic surfactant is higher than 1.0% by weight, the polishing speed of the polishing surface may be deteriorated. More preferably, the concentration of this nonionic surfactant should be confined within the range of 0.1 to 0.5% by weight based on a total weight of the slurry.

If the material to be polished is formed of resist, the concentration of the nonionic surfactant should preferably be confined within the range of 0.001 to 0.1% by weight based on a total weight of the slurry. If the concentration of the nonionic surfactant is less than 0.001% by weight, it would be impossible to sufficiently secure the effects of the surfactant. On the other hand, if the concentration of the nonionic surfactant is higher than 0.1% by weight, the polishing speed of the polishing surface may be deteriorated.

In order to secure a suitable degree of adsorption of the nonionic surfactant to a polishing substrate and to secure a suitable degree of hydrophilicity of the polishing substrate, the mixing ratio between the first surfactant and the second surfactant should preferably be around 1:1. Incidentally, if the second surfactant having a relatively large HLB value is incorporated into the slurry excessively, the content of the first surfactant is proportionally decreased, thereby making it difficult to enable the slurry to sufficiently adsorb onto the surface of hydrophobic substrate. In order to avoid such a problem, the concentration of the second surfactant should preferably be limited so as not to exceed the concentration of the first surfactant. More preferably, it is preferable that the second surfactant is incorporated at a ratio (by weight) of about 0.5 to 1 times as much as the first surfactant.

Although there is not any particular limitation with respect to the weight average molecular weight of the aforementioned surfactants, if the weight average molecular weight thereof exceeds 3000, the polishing speed may be greatly decreased. On the other hand, in view of the stability of the surfactants in the slurry as well as in view of easiness of mechanical polishing, the lower limit of the weight average molecular weight of the surfactants should preferably be around 200. As long as the weight average molecular weight of the surfactants is confined within the aforementioned range, it is possible to prevent the decrease of polishing speed that may occur due to excessive adsorption of the surfactants onto the polishing surface of substrate, to prevent abnormal increase of polishing speed that may occur due to the aggregation of abrasive grains, and to prevent the generation of scratches in the polishing surface of substrate by bulky particles. As a result, it is now possible to perform a stable polishing.

As long as the effects of the nonionic surfactant are not badly affected, it is possible to incorporate other kinds of surfactants such as cationic surfactants or anionic surfactants. Specific examples of the cationic surfactant include, for example, aliphatic amine salts, aliphatic ammonium salts, etc. As for specific examples of the anionic surfactant, they include, for example, fatty acid soap; carboxylates such as alkyl ether carboxylate; sulfonates such as alkyl benzene sulfonate, alkyl naphthalene sulfonate, α-olefin sulfonate, etc.; sulfuric esters such as higher alcohol sulfuric ester, alkyl ether sulfate; and phosphates such as alkyl phosphate, etc.

The mixing ratio of these surfactants should preferably be limited to 1% by weight or less, more preferably within the range of 0.005 to 0.5% by weight based on a total weight of the slurry.

As for the abrasive grains to be employed in the slurry according to the embodiment of the present invention, it is possible to employ at least one kind of inorganic particles selected from the group consisting of colloidal silica, fumed silica, colloidal alumina, fumed alumina, colloidal titania, fumed titania, and ceria. Alternatively, it is also possible to employ, as an abrasive grain, particles of resin such as polystyrene, polymethyl methacrylate (PMMA), etc. or a composite particle wherein the surface of resinous particle is covered with inorganic particles. In order to minimize the problems such as the generation of scratches, the size of abrasive grain should preferably be 10-50 nm in primary particle diameter and 10-100 nm in secondary particle diameter. Further, the concentration of the abrasive grain may be confined within the range of 0.1 to 5% by weight. If the concentration of the abrasive grain is less than 0.1% by weight, it may become difficult to achieve a practical polishing speed. On the other hand, if the concentration of the abrasive grain exceeds 5% by weight, the dispersibility of the abrasive grain would be deteriorated.

The slurry for CMP according to the embodiment of the present invention can be prepared by dispersing the aforementioned components in a dispersion medium. As for the dispersion medium, it is possible to employ water such as pure water, ion-exchange water, etc., and alcohols. Depending on circumstances, the slurry for CMP according to the embodiment of the present invention may be prepared over a polishing pad. More specifically, a dispersion liquid wherein an abrasive grain is dispersed in pure water for example and a solution comprising the first and the second nonionic surfactants are separately fed via separate lines onto the polishing pad. Even if these dispersion liquid and solution are supplied through two separate routes when polishing, almost the same effects can be achieved according to the same mechanism as already explained above.

If required, various additives such as an oxidant, a complexing agent, an antioxidant may be incorporated in a slurry or a pH-adjusting agent may be incorporated in the slurry so as to adjust the pH of the slurry, thereby obtaining the slurry for CMP according to the embodiment of the present invention.

As for the oxidant, it is possible to employ, for example, ammonium persulfate, potassium persulfate, ferric sulfate, diammonium cerium nitrate, hydrogen peroxide, etc. As for the antioxidant, it is possible to employ quinaldinic acid, quinolinic acid, 7-hydroxy-5-methyl-1,3,4-triazaindolizine and benzotriazole (BTA). As for the polishing-promoting agent, it is possible to employ glycine, alanine, malic acid, maleic acid, lactic acid, oxalic acid, malonic acid, etc. As for the pH-adjusting agent, it is possible to employ KOH, ammonia, ethylene diamine, nitric acid, hydrochloric acid, phosphoric acid, etc.

Since the slurry for CMP according to the embodiment of the present invention comprises two kinds of nonionic surfactants each having a predetermined range of HLB value, it is now possible to perform the polishing of substrate at a sufficiently high polishing speed while suppressing the generation of erosion. Incidentally, in order to secure a practical in-plane uniformity of polishing surface, the polishing load should be set to 170 gf/cm$^2$ or more, more preferably the range of 200 to 700 gf/cm$^2$. When the in-plane uniformity ($\sigma$) that can be determined through the measurement of 19 points set linearly across a 8-inch wafer is confined to not more than 4% in fluctuation, it can be said as being practically uniform. It has been found out that unless the polishing load to be applied is 170 gf/cm$^2$ or more, the value of this in-plane uniformity ($\sigma$) would be increased higher than 8%.

Embodiment 1

Next, this embodiment will be explained with reference to FIGS. 1 to 3.

First of all, as shown in FIG. 1, a first low dielectric constant insulating film 11 and a second low dielectric constant insulating film 12 were successively deposited on a semiconductor substrate 10, such as a silicon substrate, having a semiconductor element (not shown) formed thereon. This first low dielectric constant insulating film 11 can be formed by a film having a low dielectric constant insulating material exhibiting a relative dielectric constant of less than 2.5. For example, this first low dielectric constant insulating film 11 can be formed by employing at least one selected from the group consisting of a film of a material having a siloxane skeleton such as polysiloxane, hydrogen silsesquioxane, polymethyl siloxane, methyl silsesquioxane, etc.; a film containing, as a major component, an organic resin such as polyarylene ether, polybenzoxazole, polybenzocyclobutene, etc.; and a porous film such as a porous silica film, etc. The first low dielectric constant insulating film 11 formed of any of these materials is fragile.

The second low dielectric constant insulating film 12 to be deposited on the first low dielectric constant insulating film 11 serves as a capping insulating film and can be formed by using an insulating material having a relative dielectric constant which is larger than that of the first low dielectric constant insulating film 11. For example, this second low dielectric constant insulating film 12 can be formed by employing at least one insulating material exhibiting a relative dielectric constant of 2.5 or more and selected from the group consisting, for example, of SiC, SiCH, SiCN, SiOC and SiOCH. The surface of the second low dielectric constant insulating film 12 which is formed by any of these materials is hydrophobic. In this case, if the contact angle of pure water at the surface exceeds 40°, the surface can be determined as being hydrophobic. Incidentally, a film comprising carbon atom is hydrophobic.

Herein, the first low dielectric constant insulating film 11 was formed to a thickness of 300 nm by spin-coating method and the second low dielectric constant insulating film 12 was formed to a thickness of 50 nm by CVD method. The first and second low dielectric constant insulating films 11 and 12 were then subjected to patterning work to form a pattern of trench 13 having a depth of 150 nm.

Then, a barrier metal film 14 and a wiring material film 15, both acting as a conductive layer 17, were successively deposited on the entire surfaces of the first and second low dielectric constant insulating films 11 and 12 each having a pattern of trench 13. In this case, although the barrier metal film 14 was formed by depositing TaN to a film thickness of about 7 nm by sputtering method, other materials such as Ti, Ta, TiSiN, TiN, and noble metals may be deposited to the same thickness as described above. These materials may be deposited also by CVD or atomic layer deposition (ALD). The wiring material film 15 was formed in such a way that after a Cu seed layer was formed by sputtering method, a Cu film having a thickness of about 180 nm was formed by plating method.

Incidentally, in the example shown in the drawing, although the insulating film on which the barrier metal film 14 and the wiring material film 15 were mounted was formed of a laminate structure comprising the first low dielectric constant insulating films 11 and the second low dielectric constant insulating film 12, the insulating film may be constituted by a single layer of insulating film. The insulating film in this case may be formed by using Black Diamond (Applied Materials Co., Ltd.) for instance. The surface of the insulating film formed of this material is also hydrophobic.

Redundant portions of the conductive layer 17 comprising the barrier metal film 14 and the wiring material film 15 were then removed by CMP treatment, thereby forming a Cu damascene wiring buried in the trench pattern 13 with a barrier metal film 14 made of TaN being interposed therebetween. The CMP was performed in two steps, i.e. the removal of the wiring material film 15 (1st polishing) and the removal of the barrier metal film 14 (2nd polishing).

Figure 4:
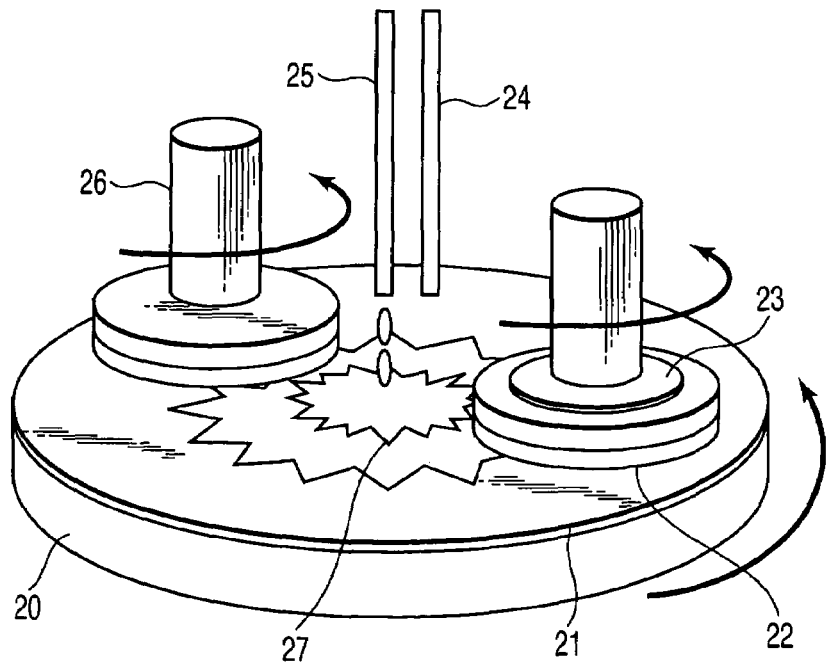
FIG. 4 is a perspective view illustrating a state of CMP.

In the 1st polishing, in order to secure the planarity of surface, a slurry which is capable of polishing Cu at a relatively high speed while polishing TaN at a lower speed, i.e. a slurry which is large in selectivity ratio between Cu and TaN is employed in polishing the wiring material film 15. More specifically, first of all, as shown FIG. 4, while rotating a turntable 20 having a polishing pad 21 attached thereto at a speed of 100 rpm, a top ring 23 holding a semiconductor substrate 22 was allowed to contact with the turntable 20 at a polishing load of 300 gf/cm$^2$. The rotational speed of the top ring 23 was set to 100 rpm, and slurry 27 was fed onto the polishing pad 21 from a slurry supply nozzle 25 at a flow rate of 250 cc/min. Herein CMS7401/CMS7452 (JSR Co., Ltd.) was employed as the slurry and IC1000 (RODEL Co., Ltd.) was employed as the polishing pad to perform the polishing for one minute. Incidentally, FIG. 4 also shows a water supply nozzle 24 and a dresser 26.

Figure 2:
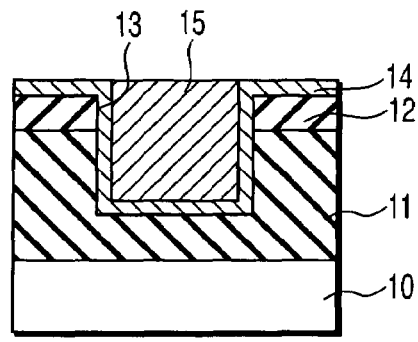
FIG. 2 is a cross-sectional view illustrating the next step following the step shown in FIG. 1.

In this manner, Cu existing over the field was removed to expose the surface of the barrier metal film 14 as shown in FIG. 2. The surface of wafer after the 1st polishing was covered with a TaN film acting as the barrier metal film 14, thus exhibiting hydrophilicity. Therefore, there is no possibility that erosion can be generated.

Figure 3:
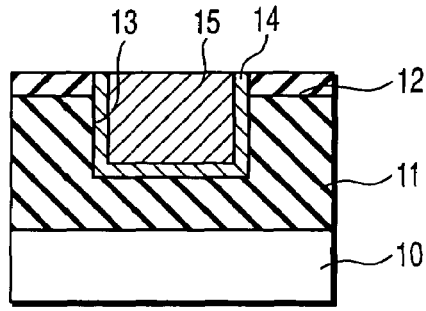
FIG. 3 is a cross-sectional view illustrating the next step following the step shown in FIG. 2.

In the 2nd polishing, the barrier metal film 14 is removed to expose the surface of the second insulating film 12 (touch-up CMP) as shown in FIG. 3, thus accomplishing the polishing. By using various kinds of slurry samples including the slurry according to the embodiment of the present invention, the 2nd polishing was performed and erosion, if any, on the polishing surface after the 2nd polishing was observed.

First of all, 3.0% by weight of colloidal silica (20 nm in primary particle diameter) employed as an abrasive grain, 1.0% by weight of quinolinic acid employed as a complexing agent, and 0.1% by weight of hydrogen peroxide acting as an oxidant were added to pure water employed as a dispersion medium to obtain a dispersion to which potassium hydroxide is incorporated to adjust the pH of the solution to pH=10.8, thus preparing a slurry stock.

To this slurry stock, polyether type nonionic surfactants were added according to the formulations shown in the following Table 1 to obtain slurry samples. The polyether type nonionic surfactants employed herein were ones having a hydrophobic portion which was constituted by siloxane or acetylene glycol. More specifically, in the samples of Nos. 1-19, a side chain-modified type polyoxyethylene/methyl polysiloxane copolymer having an average molecular weight of 2000 or less was employed. Whereas in the sample of No. 20, an acetylene glycol polyether adduct having an average molecular weight of 2000 or less was employed.

The second polishing was performed under the same conditions as those of the aforementioned first polishing except that the polishing load was changed to 200 gf/cm$^2$ and each of slurries were fed onto the polishing pad at a flow rate of 200 cc/min. The barrier metal film 14 was removed and the second insulating film 12 was scraped down by about 20 nm, thus finishing the second polishing.

The polishing speeds of the wiring material film 15, the barrier metal film 14 and the second insulating film 12 were 60, 45 and 20 nm/min, respectively. The in-plane uniformity ($\sigma$) after the second polishing was 4% or less.

The erosion on the polishing surface of substrate after the second polishing was observed by TENCOR INSTRUMENTS ALPHA-STEP 200, the results thus obtained being summarized in the following Table 1. Table 1 also shows the clouding point of each of the surfactants. Incidentally, the clouding point of the surfactant was measured as follows. First of all, each surfactant was dissolved in pure water to prepare a 5 wt % solution, which was poured in a quartz beaker and heated by using a heater to measure the temperature at which turbid generated, thus determining the clouding point. When the temperature of the surface of polishing pad was measured during the polishing by a radiation thermometer, the maximum ultimate temperature was found 51° C.

TABLE 1

| | 1st nonionic surfactants | | | 2nd nonionic surfactants | | | |
|---|---|---|---|---|---|---|---|
| No. | Clouding point (° C.) | HLB value | Conc. (wt %) | Clouding point (° C.) | HLB value | Conc. (wt %) | Erosion (nm) |
| 1 | 32 | 6 | 0.005 | 63 | 14 | 0.005 | 19 |
| 2 | 32 | 6 | 0.05 | 63 | 14 | 0.05 | 15 |
| 3 | 32 | 6 | 0.01 | 63 | 14 | 0.05 | 20 |

TABLE 1-continued

| | 1st nonionic surfactants | | | 2nd nonionic surfactants | | | |
|---|---|---|---|---|---|---|---|
| No. | Clouding point (° C.) | HLB value | Conc. (wt %) | Clouding point (° C.) | HLB value | Conc. (wt %) | Erosion (nm) |
| 4 | 32 | 6 | 0.05 | 63 | 14 | 0.01 | 19 |
| 5 | 32 | 6 | 0.03 | 63 | 14 | 0.03 | 15 |
| 6 | 32 | 6 | 0.04 | 63 | 14 | 0.02 | 15 |
| 7 | 32 | 6 | 0.1 | 63 | 14 | 0.1 | 12 |
| 8 | 32 | 6 | 0.5 | 63 | 14 | 0.5 | 2 |
| 9 | 25 | 5 | 0.05 | 55 | 10 | 0.05 | 18 |
| 10 | 19 | 3 | 0.05 | 63 | 14 | 0.05 | 15 |
| 11 | 51 | 9 | 0.05 | 63 | 14 | 0.05 | 20 |
| 12 | 19 | 3 | 0.05 | 100 | 20 | 0.05 | 18 |
| 13 | 19 | 3 | 0.05 | 80 | 18 | 0.05 | 14 |
| 14 | 12 | 2 | 0.05 | 63 | 14 | 0.05 | 22 |
| 15 | 55 | 10 | 0.05 | 63 | 14 | 0.05 | 22 |
| 16 | 32 | 6 | 0.1 | — | — | — | 36 |
| 17 | — | — | — | 63 | 14 | 0.1 | 30 |
| 18 | 25 | 6 | 0.05 | 38 | 7 | 0.05 | 38 |
| 19 | 63 | 14 | 0.05 | 84 | 16 | 0.05 | 30 |
| 20 | 33 | 6 | 0.05 | 64 | 16 | 0.05 | 18 |

As shown in Table 1, since the slurry samples of Nos. 1-13 and 20 contained not only the first surfactant having an HLB value ranging from 3 to 9 at room temperature but also the second surfactant having an HLB value ranging from 10 to 20 at room temperature, it was possible to suppress the erosion to 20 nm or less in depth. In these slurry samples, the clouding point of the first surfactant was confined within the range of 19 to 51° C., all of which are not higher than the temperature (i.e., 51° C.) of the surface of the polishing pad. The clouding point of the second surfactant was confined within the range of 55 to 100° C., i.e. all sufficiently higher than 51° C. Especially, in the case of the slurry samples of Nos. 2, 7, 8, 10 and 13 where the HLB value of the first surfactant was confined within the range of 3 to 7, the HLB value of the second surfactant was confined within the range of 12 to 18 and a total concentration of these surfactants was not less than 0.1% by weight, it was possible to further minimize the magnitude of erosion to 15 nm or less in depth.

Figure 5:
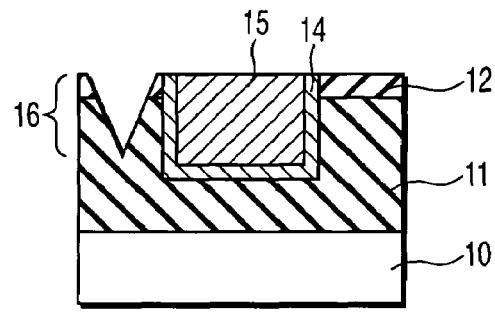
FIG. 5 is a cross-sectional view illustrating a state of a semiconductor device which was subjected to touch-up according to the conventional method.

Whereas, in the case of the slurry samples of Nos. 16 and 17 where only one of the first and the second surfactants was included in the slurry, a large magnitude of erosion 16, e.g. up to 36 nm in depth, generated as shown in FIG. 5. Further, in the case of the slurry samples of Nos. 15 and 19 where the HLB value of the first surfactant was 10 or more as well as in the case of the slurry sample of No. 18 where the HLB value of the second surfactant was 9 or less, the erosion was increased over 20 nm in depth. In the case of the slurry sample of No. 14 where the HLB value of the first nonionic surfactant was less than 3, the erosion was also increased over 20 nm in depth.

It will be concluded from these results described above that in order to suppress the magnitude of erosion, it is necessary to secure a suitable degree of adsorption and to make the polishing surface hydrophilic by using two kinds of surfactants. In the case of the slurry where a surfactant having a HLB value of 9 or less was not included therein, the adsorption thereof could be effected only through physical adsorption by the surfactant, so that the slurry samples of Nos. 15, 17 and 19 were insufficient in adsorption. On the other hand, in the case of the slurry samples of Nos. 16 and 18, although the adsorption thereof may be sufficient, only the surfactants having a HLB value of 9 or less and a clouding point which was lower than the temperature of the polishing pad were included therein. Because of this, it was assumed impossible to make the polishing surface sufficiently hydrophilic, giving rise to abnormal polishing and generating a large magnitude of erosion.

In the cases of the slurry samples of Nos. 1-13 and 20, the first surfactants whose clouding point was not higher than the surface temperature of polishing pad (51° C.) adsorbed onto the polishing surface and then the second surfactants whose clouding point was sufficiently higher than 51° C. adsorbed onto the layer of first surfactant. As a result, it was possible to realize a suitable degree of adsorption and to make the polishing surface hydrophilic, thus suppressing the erosion to 20 nm or less in depth. Although the polishing load applied in these samples was set to 200 gf/cm², the peeling of the second insulating film 12 after the polishing was not observed at all. Further, the dishing of Cu in the wiring having a line width of 100 μm was confined to 20 nm or less. As long as the dishing of Cu is confined to such a magnitude, substantially no problem would be raised.

In the case of the surfactants employed in the slurry sample of No. 20, the HLB value, clouding point and concentration thereof were almost the same as those of the slurry sample of No. 2. It will be recognized from the comparison of these results that since the erosion could be minimized much more when the slurry of No. 2 was employed, the employment of siloxane as the hydrophobic portion of surfactant was more effective in the polishing of the insulating film in this case. Incidentally, when the polishing was performed using a slurry which was prepared according to the same formulation as that of the slurry of No. 2 except that polyoxyethylene alkylether (clouding point=38° C.; HLB value=6) was employed as the first surfactant and polyoxyethylene laurylether (clouding point=70° C.; HLB value=16) was employed as the second surfactant, the erosion was limited to 20 nm in depth.

Incidentally, in the CMP of Cu, a complex will be formed on the surface of Cu, thus making the surface of Cu hydrophobic. However, when the slurry according to the embodiment of the present invention is employed, there is little possibility that hydrophobic Cu complex dissolves more than required. Therefore, it is now possible to avoid the etching of Cu.

Embodiment 2

The slurry for CMP according to the embodiment of the present invention can be applied to the formation of shallow trench isolation (STI). This embodiment will be explained with reference to FIGS. 6 and 7.

Figure 6:
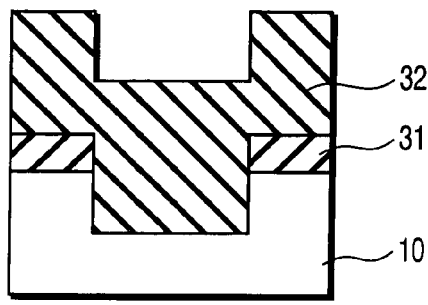
FIG. 6 is a cross-sectional view illustrating one step in the method of manufacturing a semiconductor device according to another embodiment of the present invention.

First of all, as shown in FIG. 6, a trench was formed on a semiconductor substrate having a CMP stopper film 31 formed thereon, and then an insulating film 32 was deposited thereon. In this case, SiN was employed as the CMP stopper film 31, and a coating type insulating film made of an organic SOG for example was employed as the insulating film 32.

Figure 7:
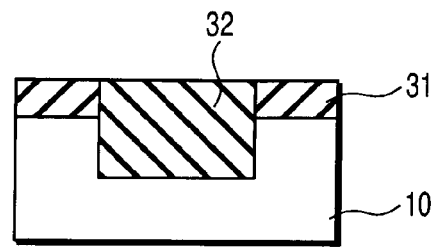
FIG. 7 is a cross-sectional view illustrating the next step following the step shown in FIG. 6.

Redundant portions of the insulating film 32 were removed by CMP, thereby exposing the surface of the CMP stopper film 31 and leaving the insulating film 32 in the trench as shown in FIG. 7. By using various kinds of slurries including the slurry according to the embodiment of the present invention, the CMP was performed and erosion, if any, on the polishing surface after the CMP was observed.

First of all, 0.4% by weight of ceria as an abrasive grain was dispersed in pure water to prepare a slurry stock. To this slurry stock polyether type nonionic surfactants were added according to the formulations shown in the following Table 2 to obtain slurry samples. The polyether type nonionic surfactants employed herein were ones having a hydrophobic portion which was constituted by siloxane. More specifically, a side chain-modified type poly(oxyethylene/oxypropylene) methyl polysiloxane copolymer having an average molecular weight of 2500 was employed. These surfactants can be said as being two kinds of hydrophilic group type surfactants.

The CMP of polishing surface was performed as follows. Namely, as shown FIG. 4, while rotating a turntable 20 having a polishing pad 21 (IC1000; RODEL Co., Ltd.) attached thereto at a speed of 130 rpm, a top ring 23 holding a semiconductor substrate 22 was allowed to contact with the turntable 20 at a polishing load of 450 gf/cm². The rotational speed of the top ring 23 was set to 130 rpm, and slurry 27 was fed onto the polishing pad 21 from a slurry supply nozzle 25 at a flow rate of 350 cc/min. The insulating film 32 was scraped down to such an extent to enable the CMP stopper film 31 to expose entirely, thus finishing the polishing.

The erosion formed on the polishing surface was observed after the polishing, the results thereof being summarized in the following Table 2. This Table 2 also shows the clouding point of each of the surfactants. When the temperature of the surface of polishing pad was measured during the polishing by a radiation thermometer, the maximum ultimate temperature was found 42° C.

TABLE 2

| No. | 1st nonionic surfactants | | | 2nd nonionic surfactants | | | Erosion (nm) |
|---|---|---|---|---|---|---|---|
| | Clouding point (° C.) | HLB value | Conc. (wt %) | Clouding point (° C.) | HLB value | Conc. (wt %) | |
| 21 | 22 | 3 | 0.05 | 88 | 16 | 0.05 | 16 |
| 22 | 45 | 7 | 0.05 | 88 | 16 | 0.05 | 18 |
| 23 | 56 | 10 | 0.05 | 88 | 16 | 0.05 | 35 |

As shown in Table 2, since the slurry samples of Nos. 21 and 22 contained not only the first surfactant having an HLB value ranging from 3 to 9 at room temperature but also the second surfactant having an HLB value ranging from 10 to 20 at room temperature, it was possible to suppress the erosion to 20 nm or less in depth. Especially, in the case of the slurry sample of No. 21 where the clouding point of the first surfactant was confined within the range of 19-32° C., it was possible to further minimize the erosion to 16 nm in depth.

Whereas, in the case of the slurry sample of No. 23 where the clouding point of the first surfactant was 56° C., the erosion was increased to 35 nm in depth, thus making it impossible to suppress the erosion to 20 nm or less in depth.

In the case of the slurry sample of No. 22, although the clouding point of the first surfactant was 45° C., which was higher than the surface temperature (i.e., 42° C.) of the polishing pad by 3° C., it was possible to restrict the erosion to as small as 18 nm in depth. This indicates that it is possible to suppress the development of erosion by converting the nature of the first surfactant from hydrophilic tendency to hydrophobic tendency. Namely, it will be understood that as long as the clouding point of the first surfactant is confined up to "the maximum ultimate temperature (on the occasion of polishing)+3° C.", it is possible to obtain the effects of the first surfactant.

Embodiment 3

The slurry for CMP according to the embodiment of the present invention can be applied to the CMP of resist. This embodiment will be explained with reference to FIGS. 8 to 12.

Figure 8:
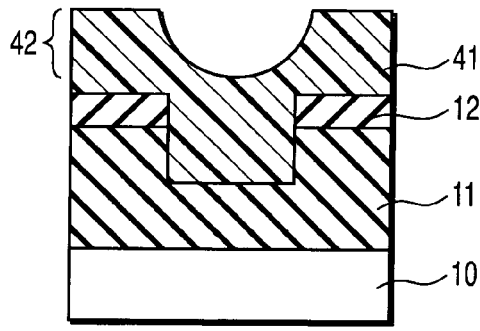
FIG. 8 is a cross-sectional view illustrating one step in the method of manufacturing a semiconductor device according to a further embodiment of the present invention.

First of all, as shown in FIG. 8, an insulating film 11 made of JSK LKD and an insulating film 12 made of Black Diamond were successively deposited on a semiconductor substrate 10, and a trench having a width of 0.3 μm and a depth of 0.2 μm was formed. Then, a resist film 41 was deposited on the entire surface. As a result, a step portion 42 generated on the surface of the resist film 41 due to the presence of the trench. Herein, IX370G (JSR Co., Ltd.) was employed as the resist.

Figure 9:
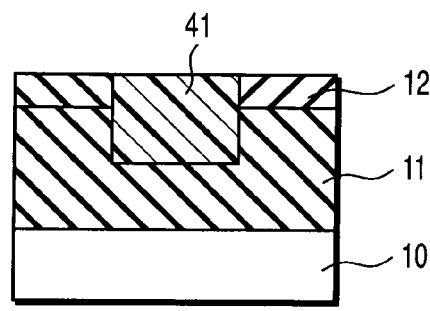
FIG. 9 is a cross-sectional view illustrating the next step following the step shown in FIG. 8.

Then, redundant portion of the resist film 41 were removed by CMP, thereby exposing the surface of the insulating film 12 while leaving the resist in the trench as shown in FIG. 9. The slurries employed herein were respectively prepared as follows. Namely, 0.1% by weight of alumina as an abrasive grain was dispersed in pure water to obtain a dispersion to which the polyether type nonionic surfactants were added according to the formulations shown in the following Table 3, thereby preparing the slurry. By using various kinds of polyether type nonionic surfactants, the influence of the hydrophobic portion thereof was examined.

The CMP of polishing surface was performed as follows. Namely, as shown FIG. 4, while rotating a turntable 20 having a polishing pad 21 (IC1000; RODEL Co., Ltd.) attached thereto at a speed of 30 rpm, a top ring 23 holding a semiconductor substrate 22 was allowed to contact with the turntable 20 at a polishing load of 450 gf/cm$^2$. The rotational speed of the top ring 23 was set to 30 rpm, and slurry 27 was fed onto the polishing pad 21 from a slurry supply nozzle 25 at a flow rate of 200 cc/min. The resist film 41 was scraped down to such an extent to enable the insulating film 12 to expose entirely, thus finishing the polishing.

The erosion formed on the polishing surface after polishing was observed, the results thereof being summarized in the following Table 3. This Table 3 also shows the clouding point of each of the surfactants. When the temperature of the surface of polishing pad was measured during the polishing by a radiation thermometer, the maximum ultimate temperature was found 37° C.

Figure 10:
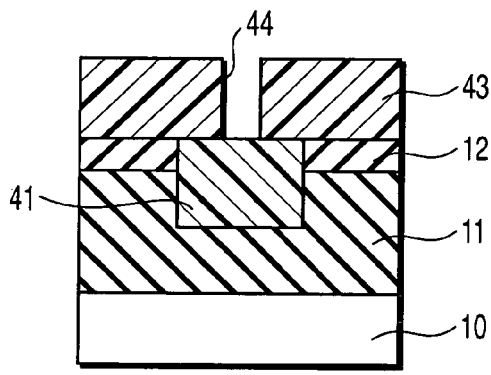
FIG. 10 is a cross-sectional view illustrating the next step following the step shown in FIG. 9.

Since the erosion was minimized as described above, it was possible to form a fine hole 44 having a diameter of 0.1 μm through the coating and exposure of a photoresist film 43 as shown in FIG. 10. It has been conventionally considered impossible to satisfactorily form such a fine hole 44 if recessed/projected portions are existed on the surface of the photoresist film 43, which may occur due to the generation of erosion on the surface of resist film 41.

Figure 11:
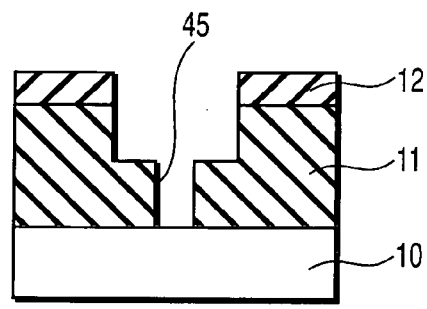
FIG. 11 is a cross-sectional view illustrating the next step following the step shown in FIG. 10.
Figure 12:
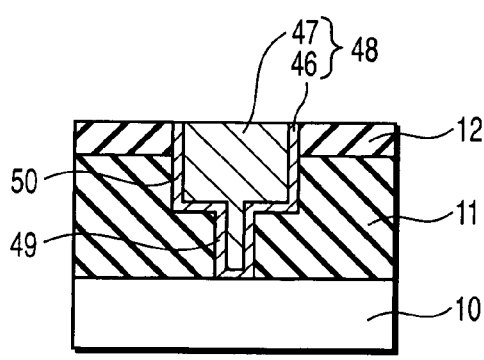
FIG. 12 is a cross-sectional view illustrating the next step following the step shown in FIG. 11.

By using the pattern thus obtained as a mask, the resist film 41 in the trench and the first insulating film 11 were worked by RIE using $O_2$ and $C_4F_8$-based gas to form a via-hole 45 as shown in FIG. 11. Incidentally, the photoresist film 43 and the resist film 41 in the trench were removed by $O_2$—RIE. Then, a barrier metal film 46 and a wiring material film 47 were successively deposited on the entire surface to form a conductive layer 48. In this case, Ta was employed as a material for the barrier metal film 46 and Cu was employed as a material for the wiring material film 47. A redundant portion of the conductive material on the second insulating film 12 was removed by CMP and at the same time, the other portion of the conductive material was permitted to leave in the trench and in the hole, thereby obtaining a dual damascene structure comprising a wiring 50 and a plug 49 as shown in FIG. 12.

According to one aspect of the present invention, it is possible to provide a slurry which is capable of reducing the erosion of polishing surface after the CMP thereof to 20 nm or less in depth. According to another aspect of the present invention, it is possible to provide a method of polishing a polishing surface at a sufficiently high polishing speed while

TABLE 3

| | 1st nonionic surfactants | | | | 2nd nonionic surfactants | | | | |
|---|---|---|---|---|---|---|---|---|---|
| No. | Clouding point (° C.) | HLB value | Conc. (wt %) | Kinds | Clouding point (° C.) | HLB value | Conc. (wt %) | Kinds | Erosion (nm) |
| 24 | 38 | 7 | 0.005 | A | 70 | 16 | 0.005 | B | 20 |
| 25 | 25 | 3 | 0.005 | C | 65 | 16 | 0.005 | C | 16 |
| 26 | 40 | 8 | 0.005 | D | 67 | 16 | 0.005 | D | 18 |
| 27 | 25 | 3 | 0.005 | C | 67 | 16 | 0.005 | D | 17 |
| 28 | 40 | 8 | 0.005 | D | 65 | 16 | 0.005 | C | 17 |

The kinds of the surfactants shown in this table respectively represent as follows and the quantity (weight %) of the hydrophilic portion thereof was respectively controlled so as to obtain a predetermined HLB value.

A: Polyoxyethylene alkylether
B: Polyoxyethylene laurylether
C: Acetylene glycol polyether adduct
D: Polyoxyethylene/methyl polysiloxane copolymer As shown in Table 3, since the slurry samples of Nos. 24-28 contained not only the first surfactant having an HLB value ranging from 3 to 9 at room temperature but also the second surfactant having an HLB value ranging from 10 to 20 at room temperature, it was possible to suppress the erosion to 20 nm or less in depth. In these slurry samples, the clouding point of the first surfactant was always confined within the range of not higher than 37+3° C., and the clouding point of the second surfactant was always confined higher than 37° C. In the case of the slurry samples of Nos. 25-28 where the hydrophobic portion of the surfactant was constituted by acetylene glycol or siloxane, the erosion was confined to 18 nm or less in depth. Especially, in the case of the slurry sample of No. 25 where the hydrophobic portions of the first and second surfactants were both constituted by acetylene glycol, it was possible to further reduce the erosion to 16 nm in depth. In view of these results, it was confirmed that the employment of acetylene glycol as the hydrophobic portion of surfactant was more effective in the polishing against the resist film.

making it possible to suppress the erosion to 20 nm or less in depth. Further, according to a further aspect of the present invention, it is possible to provide a method of manufacturing a semiconductor device excellent in reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method comprising:
contacting a polishing surface of a semiconductor substrate with a polishing pad attached to a turntable; and
dropping a CMP slurry onto the polishing pad to polish the polishing surface, the CMP slurry being selected from the group consisting of a first slurry and a second slurry, the first slurry comprising an abrasive grain, and a mixed surfactant comprising a first nonionic surfactant formed of a polyether type nonionic surfactant having an HLB value ranging from 3 to 9 at room temperature and a second nonionic surfactant formed of a polyether type nonionic surfactant having an HLB value ranging from 10 to 20 at room temperature, and the second slurry comprising an abrasive grain, and a mixed surfactant comprising a first nonionic surfactant having a clouding point ranging from 19 to 51° C. and a second nonionic surfactant having a clouding point of 55° C. or more.

2. The polishing method according to claim 1, wherein the polishing surface is a surface of a conductive layer or of an insulating film, and a total concentration of the first nonionic surfactant and the second nonionic surfactant in the first slurry or in the second slurry is confined within the range of 0.01 to 1.0 wt %.

3. The polishing method according to claim 1, wherein the polishing surface is a surface of a resist film, and a total concentration of the first nonionic surfactant and the second nonionic surfactant in the first slurry or in the second slurry is confined within the range of 0.001 to 0.1 wt %.

4. The polishing method according to claim 1, wherein the polishing surface contains Si, and the first and second nonionic surfactants have, respectively, siloxane as a hydrophobic portion.

5. The polishing method according to claim 1, wherein the polishing surface contains C, and the first and second nonionic surfactants have, respectively, acetylene glycol as a hydrophobic portion.

6. A method of manufacturing a semiconductor device comprising:

forming an insulating film above a semiconductor substrate;

forming a recess in the insulating film;

depositing a conductive material inside the recess and above the insulating film to form a conductive layer; and removing the conductive material which is deposited above the insulating film by CMP using a CMP slurry to expose the insulating film while selectively leaving the conductive material in the recess; the CMP slurry being selected from the group consisting of a first slurry and a second slurry, the first slurry comprising an abrasive grain, and a mixed surfactant comprising a first nonionic surfactant formed of a polyether type nonionic surfactant having an HLB value ranging from 3 to 9 at room temperature and a second nonionic surfactant formed of a polyether type nonionic surfactant having an HLB value ranging from 10 to 20 at room temperature, and the second slurry comprising an abrasive grain, and a mixed surfactant comprising a first nonionic surfactant having a clouding point ranging from 19 to 51° C. and a second nonionic surfactant having a clouding point of 55° C. or more.

7. The method of manufacturing a semiconductor device according to claim 6, wherein the first and second nonionic surfactants have, respectively, siloxane or acetylene glycol as a hydrophobic portion.

* * * * *